United States Patent
Padmanabhan et al.

(10) Patent No.: US 9,837,399 B2
(45) Date of Patent: Dec. 5, 2017

(54) CASCODE CONFIGURED SEMICONDUCTOR COMPONENT AND METHOD

(71) Applicant: Semiconductor Components Industries, LLC, Phoenix, AZ (US)

(72) Inventors: Balaji Padmanabhan, Temp, AZ (US); Prasad Venkatraman, Gilbert, AZ (US); Chun-Li Liu, Scottsdale, AZ (US); Ali Salih, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/197,255

(22) Filed: Jun. 29, 2016

(65) Prior Publication Data

US 2017/0025403 A1    Jan. 26, 2017

Related U.S. Application Data

(60) Provisional application No. 62/196,655, filed on Jul. 24, 2015.

(51) Int. Cl.
*H01L 27/02* (2006.01)
*H01L 29/20* (2006.01)
*H01L 29/16* (2006.01)
*H01L 21/8258* (2006.01)
*H01L 29/778* (2006.01)
*H01L 27/06* (2006.01)
*H01L 29/861* (2006.01)

(52) U.S. Cl.
CPC ...... *H01L 27/0266* (2013.01); *H01L 21/8258* (2013.01); *H01L 27/0255* (2013.01); *H01L 27/0629* (2013.01); *H01L 29/16* (2013.01); *H01L 29/2003* (2013.01); *H01L 29/7787* (2013.01); *H01L 29/861* (2013.01)

(58) Field of Classification Search
CPC . H01L 27/0266; H01L 29/2003; H01L 29/16; H01L 27/0255; H01L 29/7787; H01L 27/0629; H01L 29/861; H01L 21/8258; H03K 17/567; H03K 17/302; H03K 17/107; H03K 17/168; H03K 2017/6875; H03K 2217/0009
See application file for complete search history.

(56) References Cited

U.S. PATENT DOCUMENTS

| | | |
|---|---|---|
| 2011/0133251 A1 | 6/2011 | He |
| 2013/0069208 A1 | 3/2013 | Briere |
| 2013/0088280 A1 | 4/2013 | Lal et al. |
| 2013/0234208 A1* | 9/2013 | Bramian ............ H03K 17/107 257/195 |

* cited by examiner

*Primary Examiner* — Roy Potter
*Assistant Examiner* — Paul Patton
(74) *Attorney, Agent, or Firm* — Rennie William Dover

(57) ABSTRACT

In accordance with an embodiment, semiconductor component having a compound semiconductor material based semiconductor device connected to a silicon based semiconductor device and a protection element, wherein the silicon based semiconductor device is a transistor. The protection element is coupled in parallel across the silicon based semiconductor device and may be a resistor, a diode, or a transistor. In accordance with another embodiment, the silicon based semiconductor device is a diode. The compound semiconductor material may be shorted to a source of potential such as, for example, ground, with a shorting element.

19 Claims, 1 Drawing Sheet

US 9,837,399 B2

CASCODE CONFIGURED SEMICONDUCTOR COMPONENT AND METHOD

The present application is a nonprovisional application of Provisional Patent Application No. 62/196,655 filed on Jul. 24, 2015, by Balaji Padmanabhan et al., titled "CASCODE CONFIGURED SEMICONDUCTOR COMPONENT AND METHOD", which is hereby incorporated by reference in its entirety, and priority thereto for common subject matter is hereby claimed.

TECHNICAL FIELD

The present invention relates, in general, to electronics and, more particularly, to semiconductor structures thereof, and methods of forming semiconductor devices.

BACKGROUND

In the past, the semiconductor industry used various different device structures and methods to form semiconductor devices such as, for example, diodes, Schottky diodes, Field Effect Transistors (FETs), High Electron Mobility Transistors (HEMTs), etc. Devices such as diodes, Schottky diodes, and FETs were typically manufactured from a silicon substrate. Drawbacks with semiconductor devices manufactured from a silicon substrate include low breakdown voltages, excessive reverse leakage current, large forward voltage drops, unsuitably low switching characteristics, high power densities, and high costs of manufacture. To overcome these drawbacks, semiconductor manufacturers have turned to manufacturing semiconductor devices from compound semiconductor substrates such as, for example, III-N semiconductor substrates, III-V semiconductor substrates, II-VI semiconductor substrates, etc. Although these substrates have improved device performance, they are fragile and add to manufacturing costs. Thus, the semiconductor industry has begun using compound semiconductor substrates that are a combination of silicon and III-N materials to address the issues of cost, manufacturability, and fragility. A III-N compound semiconductor material formed on a silicon substrate or other semiconductor substrate has been described in U.S. Patent Application Publication Number 2011/0133251 A1 by Zhi He and published on Jun. 9, 2011, and in U.S. Patent Application Publication Number 2013/0069208 A1 by Michael A. Briere and published on Mar. 21, 2013.

Semiconductor manufacturers have used a combination of silicon semiconductor materials and III-N semiconductor materials to manufacture devices, such as a normally-on III-N depletion mode HEMT cascoded with a silicon device. Using this combination of materials helps achieve a normally-off state using a III-N depletion mode device that is normally-on. In cascoded devices configured as switches, the silicon device often operates in avalanche mode due to high leakage currents of the III-N device operating under a high drain bias. In the avalanche operating mode, the gate of the III-N device is under a large stress because the avalanche breakdown voltage of the silicon device may exceed the breakdown voltage of the gate dielectric of the III-N device. Hard stress conditions such as operating the silicon device in the avalanche mode degrades device reliability, lowers the breakdown voltage, increases leakage currents, and may degrade the reliability of the silicon device. Cascoded semiconductor devices have been described in U.S. Patent Application Publication Number 2013/0088280 A1 by Rakesh K. Lal et al. and published on Apr. 11, 2013.

Accordingly, it would be advantageous to have a cascoded semiconductor device and a method for manufacturing the cascoded semiconductor device that would decrease the probability of the silicon device from entering avalanche breakdown. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
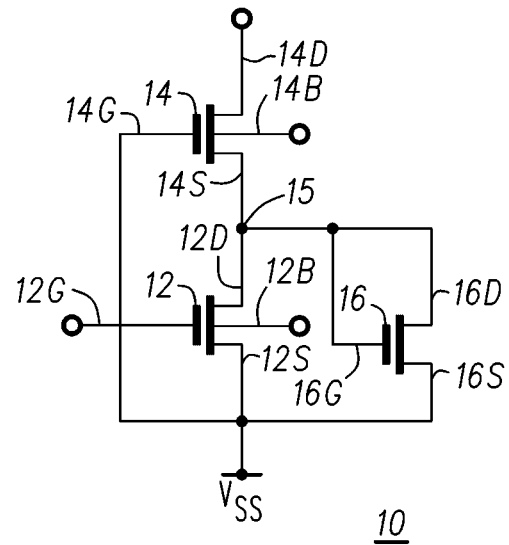
FIG. 1 is a circuit schematic of a cascoded semiconductor component that includes a compound semiconductor substrate in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of being exactly as described.

DETAILED DESCRIPTION

Generally, the present invention provides a semiconductor component comprising a semiconductor device configured from a silicon based material, a semiconductor device configured from a III-N semiconductor material, and a protection element. The semiconductor device configured from the silicon based semiconductor material has at least a pair of current carrying terminals and the semiconductor device configured from the III-N semiconductor material has a control terminal and a pair of current carrying terminals. A current carrying terminal of the silicon based semiconductor device is connected to a current carrying terminal of the III-N semiconductor device to form a common connection node and the control terminal of the III-N semiconductor device is connected to the other current carrying terminal of the silicon based semiconductor device. The protection element has a terminal connected to the common connection node and a terminal commonly connected to other current carrying terminal of the silicon based semiconductor device and to the control terminal of the III-N semiconductor device to form a terminal of the semiconductor component. The other current carrying terminal of the III-N semiconductor device serves as another terminal of the semiconductor component. The protection element may be referred to as a current steering element.

A protection device is coupled to a semiconductor device configured from a silicon based material is coupled to a semiconductor device configured from a III-N semiconductor material, and a protection device is coupled to the combination of the semiconductor device and the III-N semiconductor material. The protection device may be a transistor configured such that its threshold voltage is greater than the absolute threshold voltage value of the III-N semiconductor device, but less than the breakdown voltage of the silicon device.

FIG. 1 is a circuit schematic of a III-N semiconductor component 10 in accordance with an embodiment of the present invention. What is shown in FIG. 1 is a semiconductor device 12 coupled to a semiconductor device 14 and configured to form a cascode switch. By way of example, semiconductor devices 12 and 14 are transistors, wherein each transistor is formed from a semiconductor substrate and has a gate terminal, a source terminal, a drain terminal, and a body region or substrate region from which a channel may be formed. The body region is a portion of the substrate. Thus, transistor 12 has a drain terminal 12D, a source terminal 12S, a gate terminal 12G, and transistor 14 has a drain terminal 14D, a source terminal 14S, a gate terminal 14G, and a substrate terminal 14B. Drain terminal 12D of transistor 12 is connected to source terminal 14S of transistor 14 and source terminal 12S of transistor 12 is connected to gate terminal 14G of transistor 14. As discussed above, the gate terminal of a transistor may be referred to as a gate or gate electrode, the source terminal may be referred to as a source, a source electrode, a current carrying terminal or a current carrying electrode, the drain terminal may be referred to as a drain, a drain electrode, a current carrying terminal, or a current carrying electrode, and the body terminal may be referred to as a substrate terminal, substrate connection, or body connection. The source terminal of transistor 12 may be referred to as the source of cascode switch 10, the drain terminal of transistor 14 may be referred to as the drain of cascode switch 10, and the gate terminal of transistor 12 may be referred to as the gate of the cascode switch 10.

In accordance with an embodiment, transistor 12 is manufactured from a silicon based material and transistor 14 is manufactured from a III-N semiconductor material. A silicon based material may include silicon, carbon doped silicon, silicon carbide material, silicon germanium material, silicon in combination with aluminum nitride, etc. A III-N semiconductor material includes gallium nitride, aluminum gallium nitride, etc. The silicon may be of P-type conductivity, N-type conductivity, or an intrinsic semiconductor material. Likewise, the III-N semiconductor material may be of P-type conductivity, N-type conductivity, or an intrinsic semiconductor material. It should be noted that the III-N material of semiconductor device 14 may be grown on a silicon substrate or some other substrate material.

It should be appreciated that transistor 14 is manufactured from a III-N semiconductor material such that the source, drain, and gates are formed from portions of the III-N substrate material. The III-N semiconductor material may be referred to as a III-N substrate material, a substrate or a substrate material. Transistor 12 is manufactured from a silicon based semiconductor material such that the source, drain, and gates are formed from portions of the silicon based semiconductor material. The silicon based semiconductor material may be referred to as a silicon based substrate material, a substrate or a substrate material.

A protection element such as, for example, a transistor 16 is connected to transistor 12, i.e., transistor 16 has a terminal connected to a common connection node 15, i.e., to commonly connected drain terminal 12D of transistor 12 and source terminal 14S of transistor 14. Transistor 16 has a drain terminal 16D connected to its gate terminal 16G, which commonly connected drain terminal 16D and gate terminal 16G of transistor 16 are connected to common node 15, i.e., drain terminal 12D and source terminal 14S of transistors 12 and 14, respectively. Thus, transistor 16 may be referred to as a diode connected transistor. Source terminal 16S of transistor 16 is commonly connected to source terminal 12S of transistor 12 and to gate terminal 14G of transistor 14. Because the commonly connected gate 16G and drain 16D terminals of transistor 16 are connected to drain terminal 12D of transistor 12 and source terminal 16S of diode connected transistor 16 is connected to source terminal 12S of transistor 12, transistors 12 and 16 are connected in parallel. Source terminals 12S and 16S of transistors 12 and 16, respectively, may be coupled for receiving a source of operating potential such as voltage $V_{SS}$. By way of example voltage $V_{SS}$ is a ground potential. In accordance with an embodiment, transistor 16 is configured to have a threshold voltage that is less than the breakdown voltage of transistor 12, but greater than the absolute value of the threshold voltage of transistor 14. It should be noted that transistor 16 is in the leakage current path of the current from III-N transistor 14 and may be sized to handle the leakage current of semiconductor component 10 when semiconductor component 10 is turned off. Protection element 16 may be referred to as a current steering element, a parallel element, a leakage path circuit, or an active protection circuit element.

As discussed above, semiconductor device 12 is manufactured from a silicon based material and semiconductor device 14 is manufactured from a III-N semiconductor material. A silicon based material may include silicon, carbon doped silicon, silicon carbide material, silicon germanium material, etc. A III-N semiconductor material includes gallium nitride, aluminum gallium nitride, etc.

In accordance with another embodiment, the III-N semiconductor substrate is coupled to source of operating potential $V_{SS}$, e.g., the III-N semiconductor substrate is connected to ground when operating potential $V_{SS}$ is ground, i.e., the III-N semiconductor substrate is grounded. Thus, terminal 14B of semiconductor device 14 is coupled to source of operating potential $V_{SS}$.

It should be noted that semiconductor device 12, semiconductor device 14, and protection element 16 may be monolithically integrated or semiconductor device 12 and protection element 16 may be monolithically integrated.

In response to a logic high voltage level at the gate terminal of transistor 12, cascode switch 10 is on and the midpoint voltage is closer to the voltage at the source of transistor 12. It should be noted that the voltage at common connection node 15 may be referred to as the midpoint voltage. In response to a logic low voltage level at gate terminal 12G of transistor 12, transistor 12 turns off and the midpoint voltage at connection node 15 increases, turning transistor 14 off once it reaches the absolute value of the threshold voltage of transistor 14. If the leakage current flowing through transistor 14 is higher than the leakage current flowing through transistor 12 and protection element 16, the voltage at the drain terminal of transistor 16 continues increasing towards the absolute value of the threshold voltage of transistor 16, which transistor 16 turns on inhibiting a further increase in the mid-point voltage. Thus, the midpoint voltage is less than the breakdown voltage of transistor 12. Preferably, transistor 16 is configured such that its threshold voltage is greater than the absolute threshold voltage value of III-N semiconductor device 14, i.e., transistor 14. Under these conditions, transistor 14 turns off and holds the drain voltage applied to transistor 14.

Figure 2:
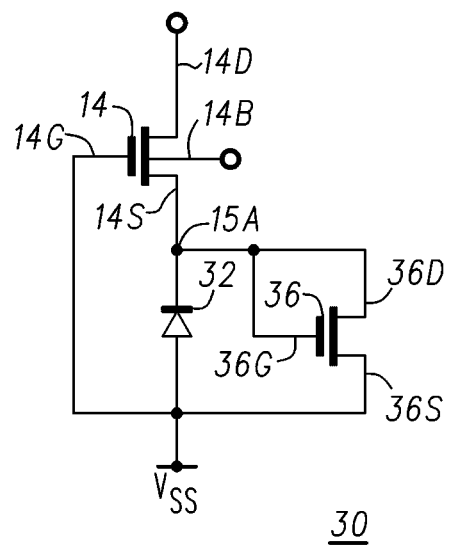
FIG. 2 is a circuit schematic of a cascoded semiconductor component that includes a compound semiconductor substrate in accordance with another embodiment of the present invention.

FIG. 2 is a circuit schematic of a III-N semiconductor component 30 in accordance with another embodiment of the present invention. What is shown in FIG. 2 is semiconductor device 32 coupled to a semiconductor device 14 and configured to form a cascode rectifier. By way of example, semiconductor device 32 is a diode and semiconductor device 14 is a transistor, wherein diode 32 has a cathode and an anode, and transistor 14 has a control terminal 14G, a source terminal 14S, a drain terminal 14D, and a body terminal 14B. The cathode of diode 32 is connected to source terminal 14S of transistor 14 to form a common connection node 15A and the anode of diode 32 is connected to gate terminal 14G of transistor 14.

A protection element such as, for example, a transistor 36 is connected to diode 32, i.e., transistor 36 has a terminal connected to the cathode terminal of diode 32 and to source terminal 14S of transistor 14. Transistor 36 has a drain terminal 36D connected to its gate terminal 36G, which commonly connected drain and gate terminals of transistor 36 are connected to the cathode terminal of diode 32 and to source terminal 14S of transistor 14. Source terminal 36S of transistor 36 is connected to the anode terminal of diode 32 and to gate terminal 14G of transistor 14. Because the commonly connected gate 36G and drain 36S terminals of transistor 36 are connected to the cathode terminal of transistor 32 and source terminal 36S of transistor 36 is connected to the anode terminal of diode 32, diode 32 and transistor 36 are connected in parallel. The anode terminal of diode 32 and source terminal 36S of transistor 36 may be coupled for receiving a source of operating potential such as, for example, voltage $V_{SS}$. By way of example voltage $V_{SS}$ is a ground potential.

In accordance with an embodiment, transistor 36 is configured to have a threshold voltage that is at a different voltage level from the voltage level of the breakdown voltage of diode 32. For example, transistor 36 may be configured to have a threshold voltage that is less than the breakdown voltage of diode 32, but higher than the absolute value of the threshold voltage of III-N transistor 14. It should be noted that transistor 36 is in the leakage current path of III-N transistor 14 and may be sized to handle the leakage current of semiconductor component 30 in response to semiconductor component 30 being turned off. Protection element 36 may be referred to as a current steering element, a parallel element, or a leakage path circuit By now it should be appreciated that a semiconductor component comprising a compound semiconductor material based transistor connected to a silicon semiconductor based transistor has been provided. In accordance with an embodiment, the semiconductor component includes a III-N based semiconductor device such as, for example, a normally-on III-N depletion mode HEMT cascoded with a silicon based device such as, for example, a field effect transistor manufactured from a silicon substrate or a diode manufactured from a silicon substrate. A component is coupled in parallel across the silicon based device to shunt leakage currents that occur in response to the gate-to-source voltage of the III-N depletion mode HEMT exceeding its pinch-off voltage. The parallel coupled component controls leakage current and the voltage at the common connection node formed by the source of the III-N based transistor and the drain of the silicon based transistor. The parallel coupled component may be a resistor, a diode, a transistor, or the like and may be referred to as a current steering device, current steering element, a protection device, or a protection element. Including the parallel coupled component increases reliability of semiconductor components that include III-N based devices cascoded with silicon based devices and in which the III-N based devices operate under high stress conditions. The substrate material of the III-N based semiconductor device may be connected to a source of potential such as, for example, ground with a shorting wire to the source of the silicon based device in embodiments where the silicon based semiconductor device is a transistor or to the anode of the silicon based semiconductor device in embodiments in which the silicon based semiconductor device is a diode. Alternatively, the semiconductor material of the III-N based semiconductor device may be left floating.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A semiconductor component having at least first and second terminals, comprising:
   a first semiconductor device having first and second current carrying terminals, the first semiconductor device configured from a silicon based material;
   a second semiconductor device having a control terminal and first and second current carrying terminals, the second semiconductor device configured from a III-N semiconductor material, the first current carrying terminal of the first semiconductor device coupled to a second current carrying terminal of the second semiconductor device, and the control terminal of the second semiconductor device coupled to the second current carrying terminal of the first semiconductor device; and
   a third semiconductor device having a control terminal and first and second current carrying terminals, the first current carrying terminal of the third semiconductor device coupled to the control terminal of the third semiconductor device, to the first current carrying terminal of the first semiconductor device, and to the second current carrying terminal of the second semiconductor device.

2. The semiconductor component of claim 1, wherein the first semiconductor device is a first transistor, the second semiconductor device is a second transistor, the third semiconductor device is a third transistor and the silicon based semiconductor material is silicon of a first conductivity type.

3. The semiconductor component of claim 1, wherein the first transistor, the second transistor, and the third transistor are monolithically integrated.

4. The semiconductor component of claim 1, wherein the first semiconductor device has a control terminal.

5. The semiconductor component of claim 1, wherein the control terminal of the second semiconductor device is coupled to the second current carrying terminal of the third semiconductor device.

6. The semiconductor component of claim 1, wherein the second current carrying terminal of the third semiconductor device is coupled for receiving a source of operating potential.

7. The semiconductor component of claim 1, wherein the first semiconductor device is a diode having a cathode and an anode, the cathode serving as the first current carrying terminal and the anode serving as the second current carrying terminal.

8. The semiconductor component of claim 1, wherein the third semiconductor device comprises a transistor having a control electrode and first and second current carrying electrodes, the gate electrode coupled to the first current carrying electrode and the second current carrying electrode coupled for receiving a first source of operating potential.

9. The semiconductor component of claim 1, wherein the third semiconductor device has a threshold voltage that is greater than an absolute threshold voltage value of the second semiconductor device.

10. A semiconductor component, comprising:
    a silicon based semiconductor device formed from a silicon semiconductor material and having first and second current carrying terminals;
    a III-N based semiconductor device formed from a III-N semiconductor material and having a control terminal, a first current carrying terminal, and a second current carrying terminal, the first current carrying terminal of the silicon based semiconductor device coupled to the control terminal of the III-N based semiconductor device, the second current carrying terminal of the silicon based semiconductor device coupled to the first current carrying terminal of the III-N semiconductor device; and
    a first transistor having a control terminal and first and second current carrying terminals, the control terminal of the first transistor coupled to the second current carrying terminal of the silicon based semiconductor device.

11. The semiconductor component of claim 10, wherein the silicon based semiconductor device comprises a diode having an anode and a cathode and the III-N based semiconductor device comprises a first field effect transistor having a gate, a source, and a drain, and wherein the anode of the diode serves as the first current carrying terminal of the silicon based semiconductor device, the cathode of the diode serves as the second current carrying terminal of the silicon based semiconductor device, the source of the first field effect transistor serves as the first current carrying terminal of the III-N based semiconductor device, and the drain of the first field effect transistor serves as the second current carrying electrode of the III-N based semiconductor device.

12. The semiconductor component of claim 10, wherein the first current carrying terminal of the first transistor is coupled to the control terminal of the first transistor and to the second current carrying terminal of the silicon based semiconductor device.

13. The semiconductor component of claim 10, wherein the silicon based semiconductor device comprises a first field effect transistor having a gate, a source, and a drain, and the III-N based semiconductor device comprises a second field effect transistor having a gate, a source, and a drain, and wherein the source of the first field effect transistor serves as the first current carrying terminal of the silicon based semiconductor device, the drain of the first field effect transistor serves as the second current carrying electrode of the silicon based semiconductor device, the source of the second field effect transistor serves as the first current carrying electrode of the III-N based semiconductor device, and the drain of the second field effect transistor serves as the second current carrying electrode of the III-N based semiconductor device.

14. The semiconductor component of claim 10, wherein the substrate of the III-N based semiconductor device is coupled to the first current carrying terminal of the first transistor.

15. The semiconductor component of claim 10, wherein the substrate of the III-N based semiconductor device is coupled for receiving a ground potential.

16. The semiconductor component of claim 10, wherein the substrate of the III-N based semiconductor device is floating.

17. The semiconductor component of claim 10, wherein the first transistor has a threshold voltage that is greater than an absolute threshold voltage value of the III-N based second semiconductor device.

18. A method for reducing stress in a semiconductor component, comprising:
    coupling a III-N based semiconductor device to a silicon based semiconductor device; and
    forming a leakage current path through a transistor, wherein the transistor has a gate and a current carrying terminal coupled to the III-N based semiconductor device and to the silicon based semiconductor device, wherein the transistor is configured so that its threshold voltage is greater than an absolute threshold voltage of the III-N based semiconductor device.

19. The method of claim 18, further including coupling one of a diode or another transistor to the III-N based semiconductor device and to the transistor.

* * * * *